United States Patent
Johnson et al.

(10) Patent No.: US 12,020,657 B2
(45) Date of Patent: Jun. 25, 2024

(54) ELECTRICAL INDICATOR AND METHOD FOR DISPLAYING AN ELECTRICAL VALUE USING A DIGITAL DISPLAY

(71) Applicant: Tyco Electronics UK LTD, Swindon (GB)

(72) Inventors: Nigel Johnson, Swindon (GB); Marta Edyta Opalinska, Swindon (GB); Jonathan Roberts, Swindon (GB)

(73) Assignee: TYCO ELECTRONICS UK LTD, Swindon (GB)

( * ) Notice: Subject to any disclaimer, the term of this patent is extended or adjusted under 35 U.S.C. 154(b) by 0 days.

(21) Appl. No.: 17/738,574

(22) Filed: May 6, 2022

(65) Prior Publication Data
US 2022/0358886 A1  Nov. 10, 2022

(30) Foreign Application Priority Data
May 7, 2021 (EP) .................................. 21172626

(51) Int. Cl.
*G09G 3/34* (2006.01)

(52) U.S. Cl.
CPC ......... *G09G 3/344* (2013.01); *G09G 2354/00* (2013.01)

(58) Field of Classification Search
CPC ...... G09G 3/344; G01R 15/12; G01R 15/125; G01R 31/3646; G01R 31/3648; G06F 3/02; G06F 3/04847
See application file for complete search history.

(56) References Cited

U.S. PATENT DOCUMENTS

| | | | |
|---|---|---|---|
| 4,467,323 A * | 8/1984 | Kling | G01P 1/08 345/440.1 |
| 8,638,206 B2 | 1/2014 | Boutin | |
| 9,640,043 B1 * | 5/2017 | Dockrey | G01B 21/047 |
| 2008/0309674 A1 * | 12/2008 | Barrus | G09G 3/344 345/545 |
| 2008/0311796 A1 * | 12/2008 | Washburn | G01R 1/0416 439/669 |
| 2013/0118279 A1 * | 5/2013 | Ohno | G01B 3/205 73/866.3 |
| 2014/0028735 A1 * | 1/2014 | Williams | G09G 3/344 345/107 |
| 2017/0153526 A1 | 6/2017 | Okabe et al. | |
| 2019/0324062 A1 * | 10/2019 | Brehm | G08B 5/36 |
| 2020/0174041 A1 * | 6/2020 | Schaefer | G01R 13/0245 |

FOREIGN PATENT DOCUMENTS

| | | |
|---|---|---|
| CN | 102290871 A | 12/2011 |
| DE | 102013214817 A1 | 2/2014 |
| EP | 2054763 A1 | 5/2009 |
| EP | 2170644 B1 | 8/2013 |
| JP | 2007057274 A | 3/2007 |
| WO | 2008153211 A | 12/2008 |
| WO | 2015014761 A1 | 2/2015 |

OTHER PUBLICATIONS

Extended European Search Report, Application No. 21172626.0-1010, dated Nov. 11, 2021, 8 pages.

* cited by examiner

*Primary Examiner* — Priyank J Shah

(57) ABSTRACT

An electrical indicator includes an interface unit receiving an electrical value to be displayed and a display unit displaying the electrical value. The display unit has a reflective display device with a scale and a pointer. The pointer is formed by selectively controllable light reflecting areas of an electronic ink layer.

7 Claims, 5 Drawing Sheets

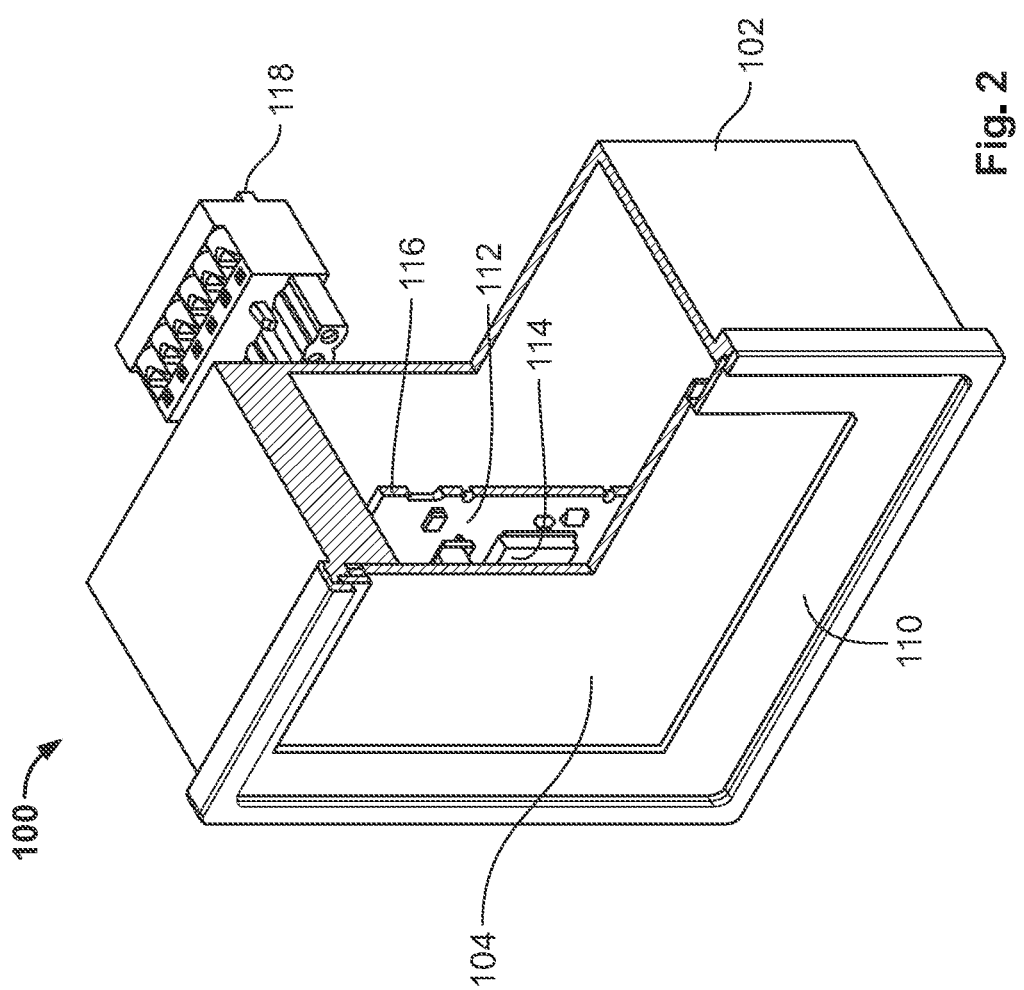

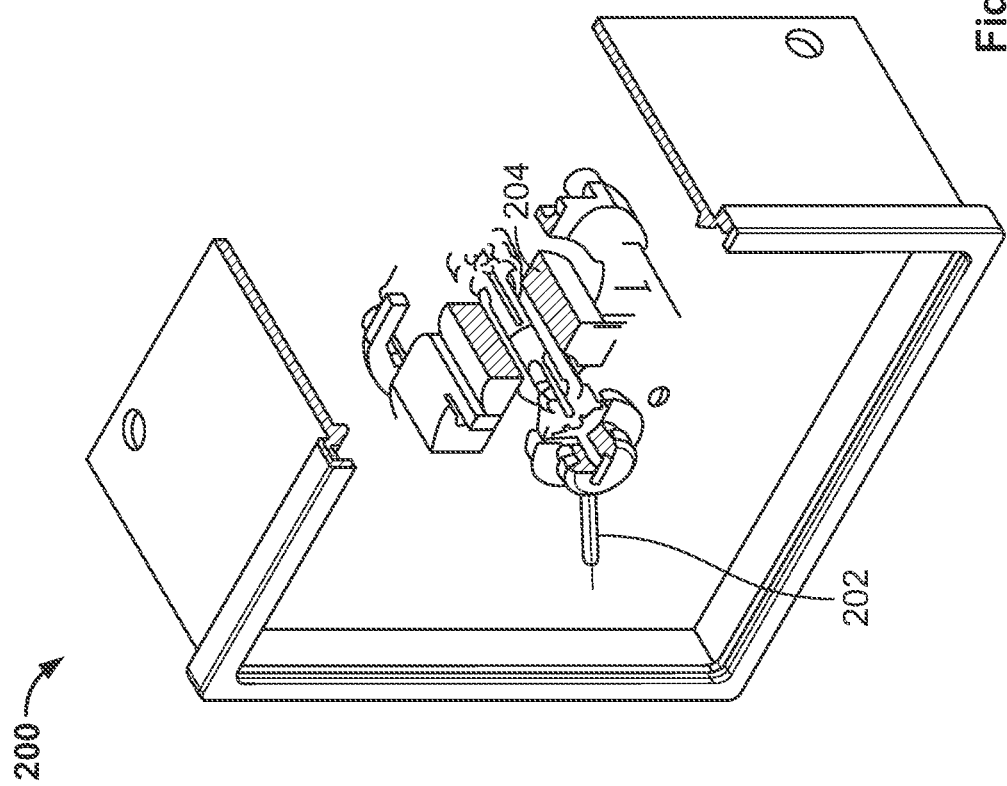

ELECTRICAL INDICATOR AND METHOD FOR DISPLAYING AN ELECTRICAL VALUE USING A DIGITAL DISPLAY

CROSS-REFERENCE TO RELATED APPLICATION

This application claims the benefit of the filing date under 35 U.S.C. § 119(a)-(d) of European Patent Application No. 21172626.0, filed on May 7, 2021.

FIELD OF THE INVENTION

The present invention relates to an electrical indicator and to a method for displaying electrical values using an electrical indicator with a digital display device.

BACKGROUND

Electrical indicators are used for a wide range of applications such as voltmeters, ammeters and wattmeters for AC/DC switchgears, panels, and distribution boards, control boards, or generator sets. As is known in the art, conventional electrical measuring devices for measuring electricity (voltmeters, ammeters, frequency meters) operate by inducing a current in a magnetic field which causes a pointer to move relative to the applied signal. The devices can be used in all system configurations (single-phase and three-phase).

Known electrical measurement devices usually have electrical indicators as schematically shown in FIG. 6. In particular, the conventional electrical indicator 200 comprises a mechanical pointer 202, which is moved according to the measurement value to be displayed. A scale is provided as a dial with the scale printed thereon. The movement of the mechanical pointer 202 is performed by a mechanical pointer drive 204. The mechanical pointer drive 204 comprises coils, magnets, and bearings which are sensitive to mechanical shock, so that it is difficult to ensure an accurate result when used in high shock environments. The assembly of the conventional mechanism 200 needs highly skilled personnel and a complex supply chain. The scale must be prefabricated and has no flexibility regarding the shown markings and partitioning.

SUMMARY

An electrical indicator includes an interface unit receiving an electrical value to be displayed and a display unit displaying the electrical value. The display unit has a reflective display device with a scale and a pointer. The pointer is formed by selectively controllable light reflecting areas of an electronic ink layer.

BRIEF DESCRIPTION OF THE DRAWINGS

The invention will now be described by way of example with reference to the accompanying Figures, of which:

FIG. 2 is a partially sectional and partially exploded perspective view of the electrical indicator;

FIG. 6 is a partially sectional perspective view of a conventional electrical indicator.

DETAILED DESCRIPTION OF THE EMBODIMENT(S)

The accompanying drawings are incorporated into the specification and form a part of the specification to illustrate several embodiments of the present invention. These drawings, together with the description, explain the principles of the invention. The drawings are merely for the purpose of illustrating examples of how the invention can be made and used, and are not to be construed as limiting the invention to only the illustrated and described embodiments. Furthermore, several aspects of the embodiments may form—individually or in different combinations—solutions according to the present invention. The following described embodiments thus can be considered either alone or in an arbitrary combination thereof. Further features and advantages will become apparent from the following more particular description of the various embodiments of the invention, as illustrated in the accompanying drawings, in which like references refer to like elements.

Figure 1:
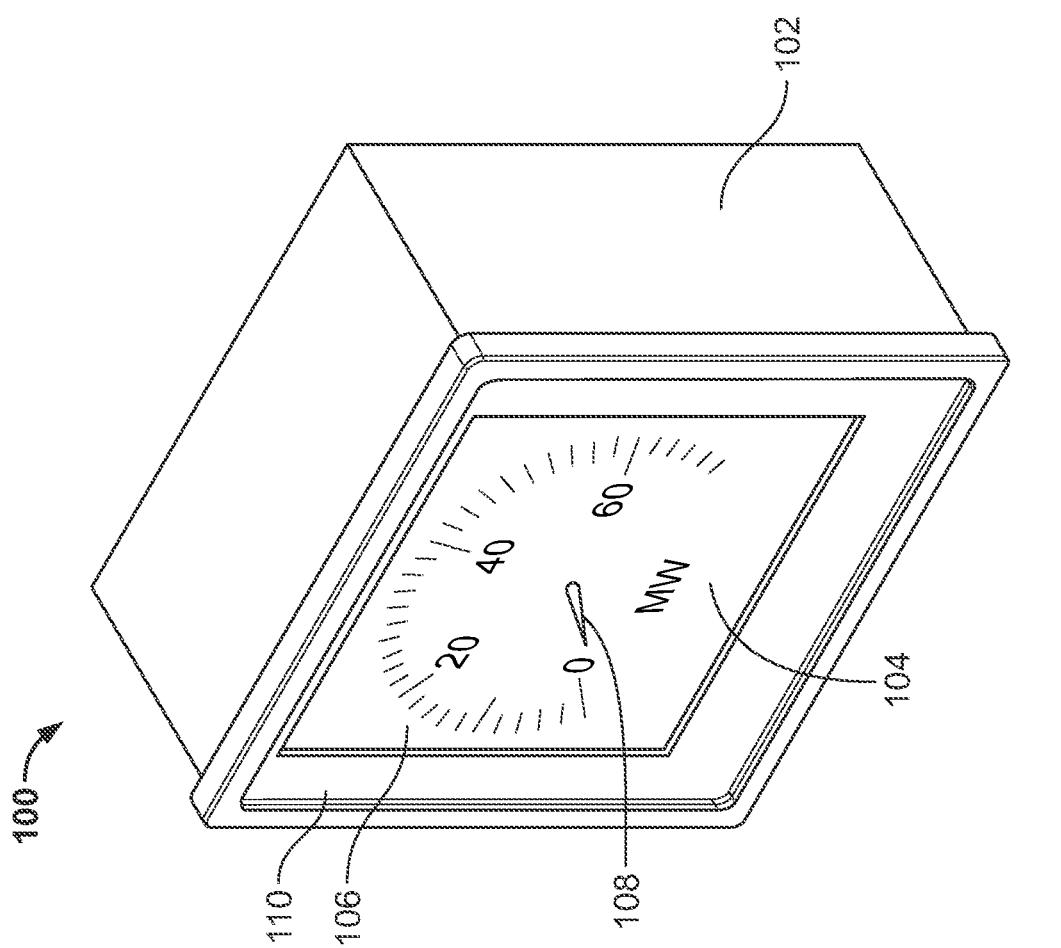
FIG. 1 is a perspective view of an electrical indicator according to an embodiment.

The present invention will now be explained in more detail with reference to the Figures and firstly referring to FIG. 1. FIG. 1 shows a perspective view of an electrical indicator 100 according to the present disclosure. In the shown example, the electrical indicator 100 is a power indicator. It is, however, clear that any other electrical parameter, such as voltage and/or current, may be displayed in addition or alternatively to the electrical power.

As shown in FIG. 1, the electrical indicator 100 has a housing 102, in which a display unit 104 is arranged so that a scale 106 and a pointer 108 are visible. The display unit 104 displays the electrical value received by the interface unit. The display unit 104 is a reflective display device, and has a reflective electrophoretic ink technology display module based on an active matrix thin film transistor (TFT) substrate. The electrical indicator 100 has an interface unit receiving an electrical value to be displayed.

The electronic ink layer of the display unit 104 is, for instance, formed by a reflective electrophoretic ink layer art. In particular, electrophoretic ink (also referred to as E Ink) is a proprietary technology developed by the E Ink Corporation that mimics the appearance of ink on paper. Because electrophoretic ink makes use of reflected light to show an image, it works well with an external light source, like a light bulb or direct sunlight. Displays using electrophoretic ink consume minimal energy.

Electrophoretic ink technology makes use of tiny capsules called microcapsules, which contain a clear fluid as well as tinier black and white particles. When an electric field is applied to such a microcapsule, the negatively charged black particles move in one direction, while the positively charged white particles go the other. Once the particles are in place, they lay suspended even when the electric field is removed. When the electric field is reversed, the particles exchange places. They stay suspended there on either side of each other even when the electric field is removed. This characteristic is called bi-stable behavior and allows the microcapsule to use almost no energy while the particles are suspended.

The display unit 104 may, for instance, have a 3.84 inches active area with 600×600 pixels. The display is, for instance, capable of displaying images at 2 to 8 gray levels (1 to 3 bits). In an embodiment, the electrophoretic ink technology display unit 104 has a high reflectance with an ultra-wide viewing angle and an ultralow power consumption. The display is bi-stable, meaning that energy has only to be used for changing the state of each pixel, but not for maintaining the pixel in the respective state. The scale 106 and the pointer 108 are formed by selectively controllable light reflecting areas of an electronic ink layer. Because each microcapsule can be exposed to a different electric field direction or polarity, it is possible to come up with a combination of electric field directions to show correspondingly different combinations of black and white on the exposed side of the display. In modern versions of the electrophoretic ink displays, also color images can be displayed by applying additional suitable color filters.

In an embodiment, a front light module is arranged behind the front frame 110 in order to illuminate the scale 106 and the pointer 108 from the front. Thus, the electrical indicator 100 is easily readable also with no or low light in the environment.

When reading the position of the pointer 108, no parallax error can occur because the pointer 108 is physically arranged within the same plane as the scale 106. Furthermore, in the shown example, the scale 106 is in MW with a maximum value of 70 MW. However, the appearance of the scale 106 can easily be modified by accordingly controlling the display unit 104 and can be adapted to the respective needs of the application environment; the end scale 106 values may individually be chosen. Moreover, it is clear that the scale 106 may also be just a passive printed part on the surface of the display unit 104. In this case, the active area of the display unit 104 may actually be smaller, thus reducing the costs of the display unit 104.

For adapting the displaying of the scale 106, the electrical indicator 100 may further comprise an input device for controlling displaying the scale 106. The input device may comprise direct manual input devices such as input keys or a touch sensitive section of the display unit 104 surface. Alternatively or additionally, the input device may be a part of the interface unit so that the displaying of the scale 106 may be controlled remotely, or may be automatically adapted to a received electrical value.

FIG. 2 illustrates a partly opened perspective view of the electrical indicator 100 of FIG. 1. Inside the housing 102, an electronic control unit (ECU) 112 is arranged. The ECU 112 comprises the electronic circuits and components 114 which are needed for controlling the display unit 104. The electronic circuits and components 114 are assembled on a printed circuit board (PCB) 116.

For connecting the electrical indicator 100 to a measurement device, a connector 118 is provided. In an embodiment, the interface unit comprises a plug connector 118 for a wire bound connection to an electrical measuring device. In this manner, a direct and accurate transfer of the measurement value to be displayed can be affected. It has be noted that the measurement value may either be the completely processed digital value, or may also be an analogue value of the voltage and current, so that the electrical indicator 100 has an integrated evaluation and control unit which performs the conversion into a digital value which can be input into the display unit 104.

Additionally or alternatively, the electronic control unit 112 may be equipped with a wireless communication interface. For instance, a wireless communication unit may for instance support Bluetooth™, Modbus™, or wireless local area network (WLAN) communication under IEEE 802.11 a/b/g. The advantage of a wireless communication unit can be seen in the fact that the electrical indicator 100 may be accessed without physically touching the measurement site.

Furthermore, in addition to a visual reading of the pointer 108, also a remote storing of the measurement values is possible. On the other hand, the measurement circuitry which is needed for measuring the voltage and the current may also be integrated within the housing 102 of the electrical indicator 100.

The ECU 112 controls the display unit 104 based on the received electrical value. This ECU 112 firstly controls the individual pixels of the electronic ink layer to show a particular image. As this is generally known, this control comprises addressing individual electrodes to build up the desired image. Usually, the addressing is performed in a scanning manner. According to the present disclosure, the ECU may also be operable to compare the pointer 108 image which is to be displayed to a currently displayed pointer 108 image and to determine those pixels which have to be changed in their status in order to display the new pointer 108 image. Then, only the pixels which have to change their status need to be addressed, which reduces energy consumption and reaction time.

In an embodiment, the electrical indicator 100 comprises a memory for storing pointer 108 images associated with electrical values. Thus, the control of the display unit 104 can be facilitated and the reaction time to a change in the pointer 108 position needed can be shortened.

Figure 3:
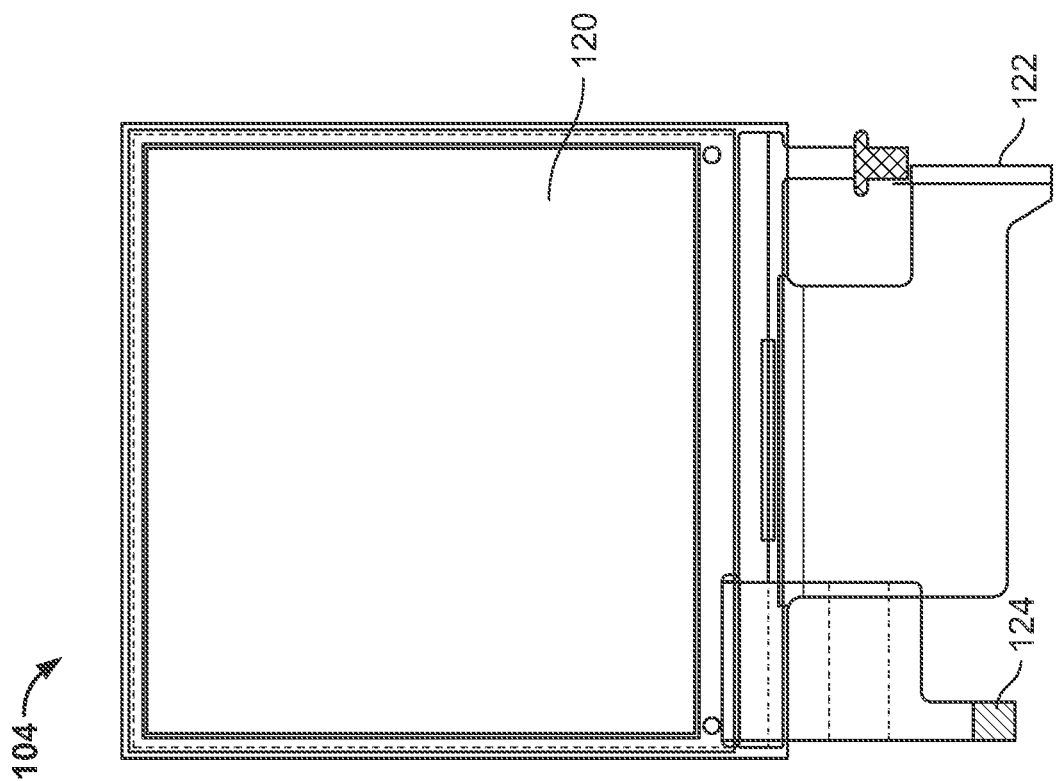
FIG. 3 is a top view of a display module of the electrical indicator.

FIG. 3 illustrates a plan view of the display unit 104 before being mounted inside the housing 102 of the electrical indicator 100. Reference numeral 120 indicates the active area of the reflective electrophoretic ink display. Electric connectors 122 and 124 are connected to the electronic control unit 112 for controlling the individual pixels of the display unit. According to the present example, the active area has dimensions of 69 mm×69 mm. The pixel pitch is 0.115 mm×0.115 mm. However, these dimensions are of course arbitrary examples and any other electronic ink display may also be used. In particular, when using a printed version of the scale 106 instead of displaying the scale 106 together with the pointer 108, a smaller active area is sufficient.

Figure 4:
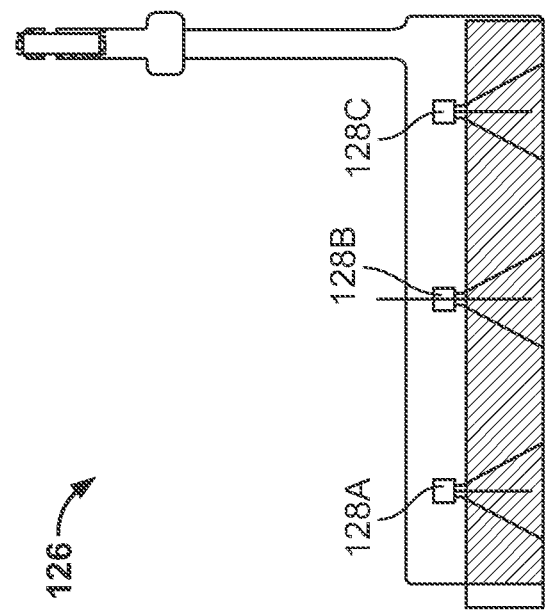
FIG. 4 is a side view of an LED lighting unit of the electrical indicator.

As mentioned above, the electrical indicator 100 may comprise a lighting or illumination unit for ensuring visibility of the pointer and scale in case of an insufficiently lighted environment. FIG. 4 shows an example of an LED lighting unit 126 according to the present example. The lighting unit 126 comprises three light emitting diodes (LEDs) 128A, 128B, and 128C. The lighting unit 126 is arranged behind the frame 110 and illuminates the active surface 120 tangentially from the side. The lighting unit 126 may either be always active or only if switched on, for instance when low external light is sensed. Of course, also more than one lighting unit 126 may be mounted behind the frame 110.

Figure 5:
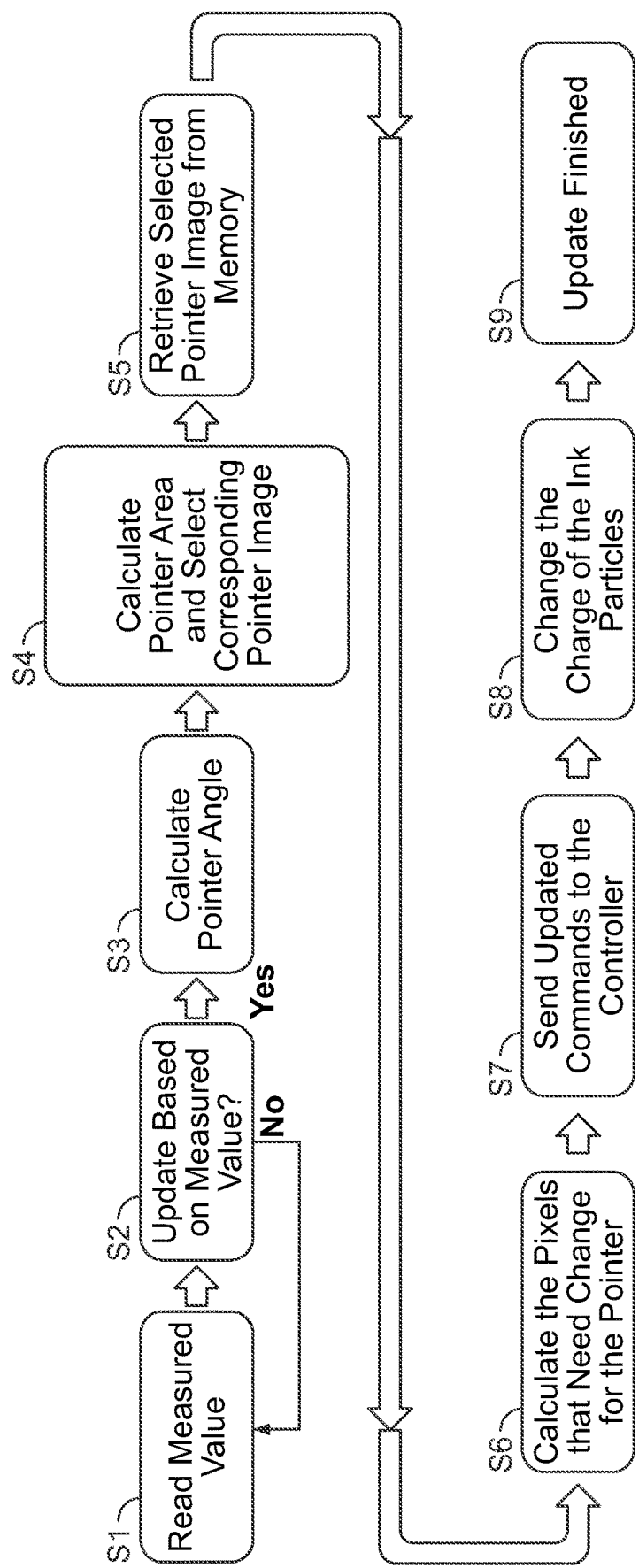
FIG. 5 is a flowchart of a method of displaying measurement results.

A method of operating the electrical indicator 100 according to the present disclosure will be explained in more detail with reference to the flow diagram shown in FIG. 5.

The process starts with step S1, where the electrical value is read via the communication interface. In step S2, it is decided whether an update of the pixel states is needed based on the measured value. In other words, it is decided whether the new measured value differs from a previous measured value which is displayed at the moment. If the answer is "NO", the process returns to step S1, if the answer is "YES", the pointer angle is calculated.

According to the present disclosure, the pointer angle is the angle that a longitudinal axis of the pointer 108 includes with a horizontal axis passing through the midpoint of the scale 106 shown in FIG. 1 (step S3).

In step S4, the pointer area is determined; in other words, those pixels which have to be activated to be visible, and a corresponding pointer image is selected. This selected pointer image is retrieved from a memory which is part of the electronic control unit (ECU) 112. From a comparison between a currently displayed pointer image and the pointer image corresponding to the newly read electrical value, in step S6 those pixels are calculated which need to change in order to display the correct pointer angle.

In step S7, updated commands are sent to the controller IC which controls the operation of the display unit 104. Consequently, the charge of the particles is changed only for those pixels which need to change their state in order to display the new angle of the pointer 108.

In step S8 the update of the pointer representation is finished and the process returns to step S1.

For enhancing visibility under low light conditions, the method may further comprise the step of illuminating the scale 106 and pointer 108. This may for instance be done by using an LED low power lighting module.

In summary, the present disclosure provides an electrical indicator which can be used in high shock environments and has an easy to read pointer 108 and scale 106. A single parameter indication is possible. In an embodiment, the scale 106 may be customer configurable. Digital communication may be performed using proprietary protocols including Bluetooth™ or Modbus™ (other protocols are also possible). The pointer 108 and scale 106 are highly visible in low light and in direct sunlight, allowing a precise display of virtually any position of the pointer 108, by closely mimicking an analogue pointer. Depending on the input variables of the electrical indicator, also more than one pointer can be displayed, each indicating another parameter. The power consumption is extremely low and the supply chain and manufacturing process are simplified compared to known mechanical solutions. As no mechanically moving parts are used, less scrap is produced during manufacturing and assembly, and a robust and accurate display can be achieved which is not susceptible to high external impacts. Moreover, due to the bi-stable characteristics of reflective electrophoretic ink, no energy needs to be provided for keeping the pointer 108 in a particular constant position.

What is claimed is:

1. An electrical indicator, comprising:
   an interface unit receiving an electrical value to be displayed, the interface unit has a plug connector for a wire bound connection to an electrical measuring device;
   an input device for controlling display of the scale; and
   a display unit displaying the electrical value comprising:
      a reflective display device with a scale and a pointer, the pointer is formed by selectively controllable light reflecting areas of an electronic ink layer, the scale is printed on a surface of the display unit; and
      a lighting unit illuminating the scale and the pointer.

2. The electrical indicator of claim 1, further comprising an electronic control unit controlling the display unit based on the electrical value.

3. The electrical indicator of claim 1, further comprising a memory storing a plurality of pointer images associated with a plurality of electrical values.

4. A method for displaying an electrical value, comprising:
   providing an electrical indicator with a reflective display device having a scale and a pointer;
   receiving an electrical value to be displayed from an interface unit, the interface unit has a plug connector for a wire bound connection to an electrical measuring device;
   determining a pointer position corresponding to the electrical value;
   retrieving a pointer image corresponding to the pointer position from a memory;
   determining a pixel array of a current pointer image;
   comparing the pixel array of the current pointer image to a pixel array of a preceding pointer image and determining a plurality of pixels that need to be controlled to change for displaying the current pointer image;
   controlling the reflective display device to display the pointer image, the pointer formed by selectively controllable light reflecting areas of an electronic ink layer to change only the pixels indicated by the retrieving step, the scale is printed on a surface of the reflective display device; and
   illuminating the scale and the pointer.

5. The method of claim 4, further comprising determining whether a currently received electrical value differs from a preceding electrical value.

6. The method of claim 5, further comprising retaining the pointer image for the preceding electrical value.

7. The method of claim 4, wherein the pointer position is a value for an angle which a longitudinal axis of the pointer includes with a horizontal reference axis of the scale.

* * * * *